United States Patent [19]
Baer et al.

[11] Patent Number: 5,127,068
[45] Date of Patent: Jun. 30, 1992

[54] APPARATUS FOR COUPLING A MULTIPLE EMITTER LASER DIODE TO A MULTIMODE OPTICAL FIBER

[75] Inventors: Thomas M. Baer, Mountain View; Mark S. Keirstead, San Jose, both of Calif.

[73] Assignee: Spectra-Physics, Inc., San Jose, Calif.

[21] Appl. No.: 614,437

[22] Filed: Nov. 16, 1990

[51] Int. Cl.⁵ .................... G02B 6/26; G02B 6/42
[52] U.S. Cl. ...................... 385/34; 385/119
[58] Field of Search .......... 385/34, 119; 372/108

[56] References Cited

U.S. PATENT DOCUMENTS

| | | | |
|---|---|---|---|
| 4,723,257 | 2/1988 | Baer et al. | 385/34 |
| 4,744,620 | 5/1988 | Ueno et al. | 385/34 |
| 5,027,359 | 6/1991 | Leger et al. | 372/108 |
| 5,046,798 | 9/1991 | Yagui et al. | 385/34 |

OTHER PUBLICATIONS

Cunningham, Collimated Light Source with Laser Diode and Microcylindrical Lens, IBM Technical Disclosure Bulletin, vol. 19, No. 2, p. 629, Jul. 1976.

*Primary Examiner*—John D. Lee
*Assistant Examiner*—Robert E. Wise
*Attorney, Agent, or Firm*—Kenneth D'Alessandro

[57] ABSTRACT

A small diameter multimode optical fiber with a low numerical aperture (i.e., 0.1) is used as a microlens to collimate the output emissions of a laser diode before butt coupling the output of the laser diode to an optical fiber. The optical fiber used as the microlens is chosen such that its diameter roughly equals the diameter of the fiber to be coupled to the laser diode. The collimation is performed in the high NA direction of the output of the laser diode. The output of a bundle of butt coupled optical fibers may be used to pump a laser system.

42 Claims, 1 Drawing Sheet

APPARATUS FOR COUPLING A MULTIPLE EMITTER LASER DIODE TO A MULTIMODE OPTICAL FIBER

BACKGROUND OF THE INVENTION

1. Field Of The Invention

The present invention relates to lasers. More specifically, the present invention pertains to laser diodes and coupling of laser diodes to multimode optical fibers.

2. The Prior Art

It is often necessary to couple a laser diode to a multimode optical fiber. The standard procedure is to butt couple the laser diode to the optical fiber, placing the optical fiber as close as possible to the emitting face of the laser diode. The output from a typical laser diode has very high angular divergence in the direction perpendicular to the diode junction, having a typical numerical aperture (NA) of 0.4 to 0.6. The numerical aperture is the sine of the half angle of the diode emission. The NA in the direction parallel to the junction is much smaller, typically 3 times less. In order to couple efficiently to a laser diode, a multimode optical fiber must have an acceptance angle or NA comparable to the NA of the laser diode. A multimode optical fiber ideal for coupling to a laser diode would have an NA of 0.3 or above. Such a multimode optical fiber is somewhat difficult to design since it requires a cladding having a very low index of refraction. Moreover, since the energy emitted from the laser diode diverges rapidly, the end of the optical fiber must be placed very close to the diode facet to which it is to be coupled. Accurately achieving such placement requires very tight mechanical tolerances and can lead to practical fabrication problems due to optical feedback to the laser diode.

An object of the present invention is to provide a convenient means of coupling a low NA multimode optical fiber to a laser diode. The resulting low NA fiber output can have high brightness, where brightness is defined as $W/c/cm^2$ unit solid angle.

BRIEF DESCRIPTION OF THE INVENTION

A microlens, such as a small diameter multimode optical fiber is used to collimate the output emissions of a laser diode before butt coupling the output of the laser diode to an optical fiber. The optical fiber used as the microlens lens is chosen such that its diameter roughly equals the diameter of the fiber to be coupled to the laser diode. The collimation is performed in the high NA direction of the output of the laser diode.

For optimal coupling, the diameter of the butt coupled fiber diameter is preferably chosen to be 20 to 50% bigger than the lateral dimension of the laser diode of diode array. The diameter of the collimating microlens is then chosen to be roughly equal to this diameter. The NA of the butt coupled fiber is chosen to be roughly equal to the low NA direction of the diode, typically 0.1 to 0.2. The microlens and the butt coupled end of the fiber may be anti-reflection coated to reduce reflections off these surfaces. The microlens is oriented so as to collimate the high numerical aperture direction of the laser diode output.

In a presently preferred embodiment, the butt coupled fiber may be rectangular in shape so as to reduce the total amount of glass in the fiber. The width of the fiber is chosen to be slightly larger (about 20–50% larger) than the diode emitting area. The height is chosen to be as small as possible, typically around 30 to 50 microns. The diameter of the microlens should then be chosen to be approximately equal to the height of rectangle.

The arrangement of the present invention for precollimation of a diode emitter can be easily extended to a laser diode bar by extending the fiber precollimating lens along the length of the bar. An array of fibers, with spacing matching the diode separation on the bar, may be butt coupled to the diode bar resulting in very high efficiency coupling of diode bars to fiber arrays.

DETAILED DESCRIPTION OF A PREFERRED EMBODIMENT

It has been discovered that by using a microlens to collimate the laser diode before butt coupling to an optical fiber significantly improves coupling efficiently and permits the use of fibers with a low NA (0.1). Moreover, it has been discovered that a piece of multimode optical fiber can serve as an inexpensive microlens. The optical fiber should be chosen such that its diameter roughly equals the diameter of the optical fiber to be coupled to the laser diode. By collimating the high NA direction of the emission from a laser diode, the butt-coupled fiber may be located further away from the diode laser (it can now be spaced several hundred microns from the laser diode emitting surface) thus reducing the mechanical tolerances of the assembly.

In a presently preferred embodiment of the invention, the microlens is cylindrical in cross section. Those of ordinary skill in the art will recognize, however, that other cross sectional shapes, such as elliptical and hyperbolic, could prove to be useful in the present invention for correction of particular spherical aberrations as is known in the art, i.e. Kingsdale, *Lens Design Fundamentals,* Academic Press 1978.

The prior art arrangement for coupling the output of laser diode bar having a plurality of emitters into a plurality of optical fibers which may be part of a fiber bundle includes placing the end of each optical fiber very close to the diode facet to which it is to be coupled because the energy emitted from the laser diode diverges rapidly. Accurate placement of the fiber end relative to the laser diode requires very tight mechanical tolerances and thus leads to practical fabrication problems.

In addition, the output from a typical laser diode has very high angular divergence in the direction perpendicular to the diode junction, having a typical NA of 0.5 to 0.6. The NA in the direction parallel to the junction is much smaller, typically 3 times less. A multimode optical fiber having an NA to ideally match the laser diode output would require a cladding having a very low index of refraction. It is difficult to produce such a fiber.

The present invention solves these practical problems and provides a solution which avoids the critical placement problems of the prior art arrangement, and allows utilization of readily available multimode optical fibers.

Figure 1:
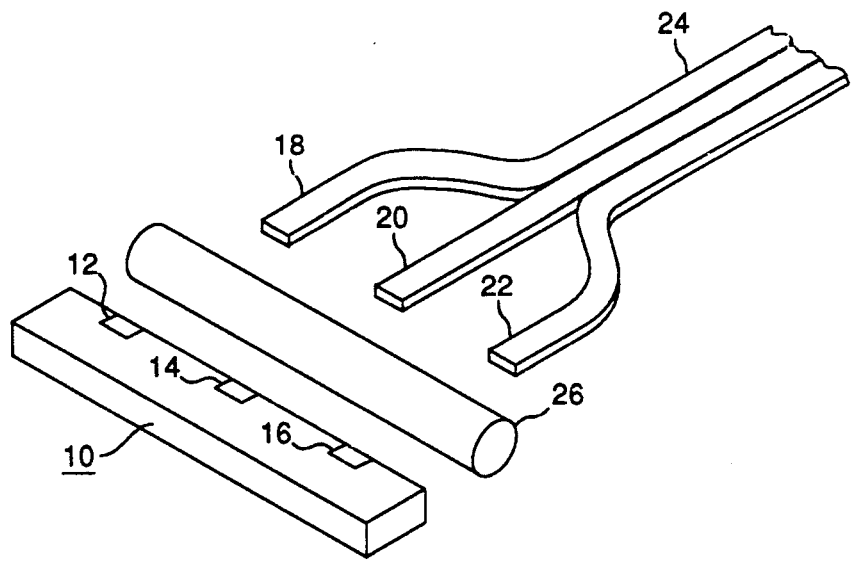
FIG. 1 is a perspective view of an arrangement according to the invention for coupling the output from a laser diode bar into an optical fiber bundle.

Referring first to FIG. 1, an arrangement according to the present invention for coupling the radiation emitted from laser diode bar 10, having a plurality of emitters 12, 14, and 16, into multimode optical fibers 18, 20, and 22, which may be part of an optical fiber bundle 24 includes placing a microlens 26 in between the emitting facets of emitters 12, 14, and 16, and the ends of multimode optical fibers 18, 20 and 22. The optimal spacing of the microlens 26 from the emitting surfaces of the emitter facets may be determined by the equation:

$$d = \frac{R(2 - n)}{2(n - 1)}$$

where d is the distance from the laser diode to the lens, n is the index of refraction of the optical fiber lens, and R is the radius of the optical fiber. A distance of approximately 60 microns from the near edge of the microlens to the diode facet is satisfactory for a 250 micron diameter fiber having an index of refraction of 1.5. The optimal spacing of the optical fiber end from the microlens should be as small as possible.

For optimal coupling, the diameter of the optical fiber to be coupled is typically chosen to be 20 to 50% bigger than the lateral dimension of the laser diode of diode array. For example given a laser diode array having a 200 micron broad area emitter, the optical fiber is chosen to be approximately 250 microns in diameter.

In a presently preferred embodiment, the diameter of microlens 26 is chosen to be roughly equal to the diameter of the optical fiber to be coupled. The diameter of microlens 26 may be chosen to be less than the diameter of the optical fiber to be coupled without loss in coupling efficiency. However, if such smaller microlens diameters are used, the alignment of the microlens will be made more difficult.

Microlens 26 must be carefully placed with respect to the output facets of the laser diode bar in order to properly collimate them. This may be accomplished by carefully aligning the microlens and securing it in place with a suitable epoxy such as Tra-Bond BB-2151 available from Tra-Con in Medford Mass.

The NA of the optical fiber to be coupled is chosen to be roughly equal to the low NA direction of the diode, typically 0.1 to 0.15. This combination of microlens and optical fiber results in greater than 80% coupling of the laser diode emitted energy into the multimode optical fiber. The microlens and the butt coupled end of the fiber may be anti-reflection coated to reduce reflections from these surfaces.

As is shown in FIG. 1, the optical fibers 18, 20, and 22 may be rectangular in cross section so as to reduce the total amount of glass in the fiber. The width of such a rectangular fiber is preferably chosen to be slightly bigger than the diode emitting area. The height is chosen to be as small as possible, typically around 30 to 50 microns. Heights smaller than 30 to 50 microns may be used but make alignment difficult. The diameter of the microlens 26 is then preferably chosen to equal the height of the rectangle, 30 to 50 microns in the example given. The resulting fiber output is brighter since the total emission area is smaller.

Figure 2:
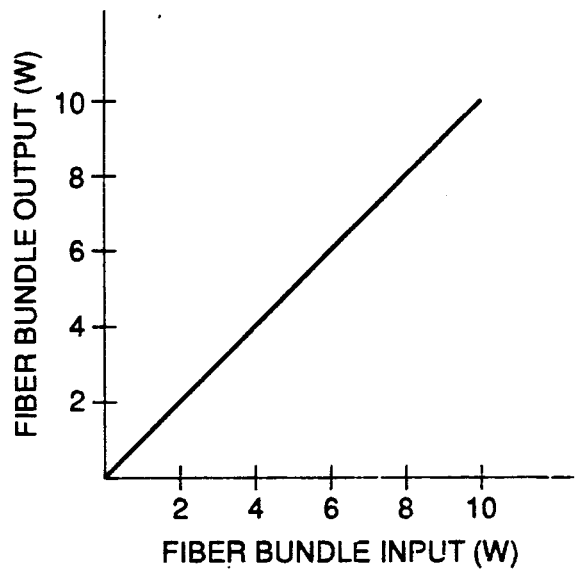
FIG. 2 is graph showing the output power from a fiber bundle as a of the input power to the fiber bundle in a system invention.

As illustrated in FIG. 1, the arrangement of the present invention for precollimation of a single laser diode emitter can be easily extended to a laser diode bar containing a plurality of laser diode emitters by extending the microlens 26 along the length of the bar to intercept the output radiation from the multiple emitters along the length of the bar. An array of optical fibers, with spacing matching the diode separation on the bar, can be efficiently butt coupled to the laser diode bar 10, resulting in very high coupling of diode bars to fiber arrays. In the example given above, ten 1W laser diode emitters contained on a 1 cm diode bar, each emitter having a 200 micron wide emission region, available from Spectra Diode Labs of San Jose, California, were coupled to a fiber array including 10 optical fibers, each having a 250 micron diameter and an output NA of 0.11, by use of a 250 micron diameter optical fiber lens spaced approximately 50 microns from the emitting surfaces of the diodes and about 300 microns from the ends of the optical fibers. The overall coupling efficiency of this arrangement was measured at about 90% as shown by the graph of FIG. 2.

The output diameter of the resulting fiber bundle is about 1 mm and the NA is 0.11. If smaller diameter emission regions are needed (for example, 0.33 mm, to pump a solid state laser) then the emitting face of the fiber optic bundle can be demagnified by using a simple high NA lens, as will be appreciated by those of ordinary skill in the art, to suitably reduce the diameter of the image of the output of the fiber bundle.

The present invention is useful for a variety of applications. One such application is as a pump source for a laser system. As an example, FIG. 3 is a block diagram illustrating how the present invention may be used as a pump source for a solid state laser, although those of ordinary skill in the art will realize that the present invention is adaptable for pumping other kinds of laser systems in other manners without departing from the concept of the invention.

Figure 3:
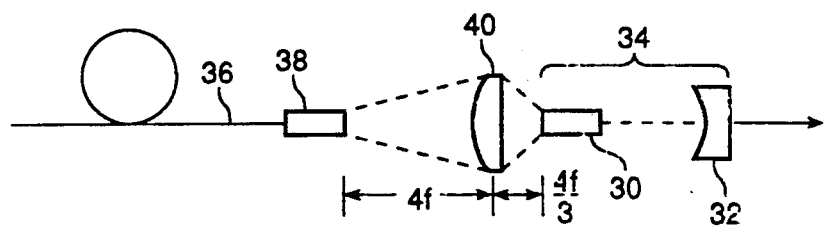
FIG. 3 is a block diagram of an embodiment of the present invention used as a pump source for a laser system.

Referring now to FIG. 3, a bar 30 of doped solid state laser material and an output coupler 32 form a laser cavity 34. As will be appreciated by those of ordinary skill in the art, the end of laser cavity 34 may be a highly reflective coating on the face of the bar 30. An optical fiber bundle 36, into which laser diode radiation has been coupled, terminates in an output coupler 38, as is well known in the art. An imaging lens 40, having a focal length f, is placed in the optical path of radiation from the optical fiber bundle 36, at a distance 4f from the surface of the output coupler 38 and at a distance 4f/3 from the face of the bar 30 forming on end of the laser cavity 34.

Those of ordinary skill in the art will recognize the geometry disclosed in FIG. 3 as an end-pumped cavity geometry, but such persons will immediately recognize that the arrangement disclosed with respect to FIG. 3 could easily be used for side pumping a laser cavity with minimal and trivial rearrangement.

A presently preferred embodiment of the invention has been disclosed. From the disclosure in conjunction with the drawings, those of ordinary skill in the art will be able to make change and modifications to the specifically described embodiments without departing from the scope of the invention which is intended to be limited only by the scope of the appended claims.

What is claimed is

1. In combination:
   a laser diode bar having a plurality of emitter regions having output facets,
   a microlens comprising an optical fiber having an axis oriented substantially perpendicular to and positioned in the emission path of radiation from said emitter regions to be optically coupled thereto and spaced therefrom by a distance of approximately one focal length of said microlens, a plurality of optical fibers equal to the number of emitter regions of said laser diode bar, and oriented on axis with respect to said microlens such that radiation from said individual ones of said emitter regions is optically coupled into individual ones of said plurality of optical fibers.

2. The combination of claim 1 wherein said microlens is substantially cylindrical in cross section and has a diameter chosen to be about 20% to 50% larger than the lateral dimension of said emitter regions.

3. The combination of claim 2 wherein the diameter of each one of said plurality of optical fibers is chosen to be about equal to the diameter of said cylindrical microlens.

4. The combination of claim 2 wherein said cylindrical microlens has an antireflective coating.

5. The combination of claim 1 wherein said microlens has a cross sectional shape selected to correct a selected spherical aberration and with an effective aperture approximately the same size as each one of said said plurality of optical fibers, said microlens placed approximately one focal length from said output facets of said emitters on said laser diode bar.

6. The combination of claim 1 wherein the numerical aperture of said plurality of optical fibers is chosen to be about equal to the numerical aperture in the low numerical aperture direction of said emitter regions.

7. The combination of claim 6, wherein the numerical aperture of each one of said optical fibers is chosen to be between about 01 to 0.2.

8. The combination of claim 1 wherein said microlens is an optical fiber.

9. The combination of claim 1, further including a focussing lens at the far end of said plurality of optical fibers.

10. In combination:
a laser diode bar having a plurality of emitter regions,
a cylindrical microlens comprising an optical fiber positioned in the emission path of radiation from said emitter regions and spaced therefrom by a distance approximately equal to where R is the radius of and n is the index of refraction of said microlens,
a plurality of optical fibers equal to the number of emitter regions of said laser diode bar, and oriented with respect to said microlens such that radiation from said individual ones of said emitter regions is optically coupled into individual ones of said plurality of optical fibers.

11. The combination of claim 10 wherein said microlens is substantially cylindrical in cross section and has a diameter chosen to be about 20% to 50% larger than the lateral dimension of said emitter regions.

12. The combination of claim 10 wherein said microlens has a cross sectional shape selected to correct a selected spherical aberration and has an effective diameter approximately equal to the diameters of each of said plurality of optical fibers to be coupled.

13. The combination of claim 10 wherein the diameter of each of said optical fibers to be coupled is chosen to be about equal to the diameter of said cylindrical microlens.

14. The combination of claim 13, wherein the numerical aperture of each of said plurality of optical fibers is chosen to be between about 0.1 to 0.2

15. The combination of claim 10 wherein the numerical aperture of said optical fibers is chosen to be about equal to the numerical aperture in the low numerical aperture direction of said emitter regions.

16. The combination of claim 10 wherein said optical fibers are rectangular in cross section and have a width chosen to be slightly larger than the emitting area of said emitter regions and have a length of between about 30 to 50 microns.

17. The combination of claim 10 wherein said microlens has an antireflective coating.

18. The combination of claim 10 further including a focussing lens at the far end of said plurality of optical fibers.

19. A diode pumped laser system, including:
cavity forming means, including an active laser medium,
a laser diode bar having a plurality of emitter regions,
a microlens comprising an optical fiber having an axis oriented substantially perpendicular to and positioned in the emission path of radiation from said emitter regions to be optically coupled thereto and spaced therefrom by a distance of approximately one focal length of said microlens,
a plurality of optical fibers equal to the number of emitter regions of said laser diode bar each of said plurality of optical fibers having a first end and a second end, each of said first ends oriented on axis with respect to said microlens such that radiation from said individual ones of said emitter regions is optically coupled into individual ones of said plurality of optical fibers, said second ends of each of said plurality of optical fibers arranged in a bundle,
means for optically coupling radiation from said bundle into said laser cavity.

20. A diode pumped laser system, including:
cavity forming means, including an active laser medium,
a laser diode bar having a plurality of emitter regions,
a microlens comprising an optical fiber having an axis oriented substantially perpendicular to and positioned in the emission path of radiation from said emitter regions to be optically coupled thereto and spaced therefrom by a distance of approximately one focal length of said microlens,
a plurality of optical fibers equal to the number of emitter regions of said laser diode bar each of said optical fibers having a first end and a second end, each of said first ends oriented on axis with respect to said microlens such that radiation from said individual ones of said emitter regions is optically coupled into individual ones of said plurality of optical fibers, said second ends of each of said plurality of optical fibers arranged in a bundle,
means for optically coupling radiation from said bundle into one end of said laser cavity.

21. A diode pumped laser system, including:
a bar of active solid state laser material disposed in a laser cavity having opposing ends, one face of said bar forming a first one of said opposing ends,
a laser diode bar having a plurality of emitter regions,
a microlens comprising an optical fiber having an axis oriented substantially perpendicular to and positioned in the emission path of radiation from said emitter regions to be optically coupled thereto and spaced therefrom by a distance of approximately one focal length of said microlens, a plurality of optical fibers equal to the number of emitter regions of said laser diode bar each one of said plurality of optical fibers having a first end and a second end, each of said first ends oriented on axis with respect to said microlens such that radiation from said individual ones of said emitter regions is optically coupled into individual ones of said plurality of optical fibers, said second ends of each of said optical fibers arranged in a bundle, means for optically coupling radiation from said bundle into said first end of said laser cavity.

22. A method of coupling the output of a laser diode emitter region into the end of an optical fiber including the steps of:

optically coupling the output radiation of said laser diode emitter region into a microlens comprising an optical fiber, said microlens spaced from said laser diode by about $$\frac{R(2-n)}{2(n-1)}$$

where R is the radius of and n is the index of refraction of said microlens, said microlens having a diameter about 20% to 50% larger than the lateral dimension of said emitter region, optically coupling the output radiation of said microlens into the end of an optical fiber, said optical fiber having a diameter about equal to the diameter of said microlens, said end of said optical fiber spaced as close as possible to said microlens, said optical fiber having a numerical aperture about equal to the numerical aperture of said emitter region of said laser diode in its low direction.

23. A method of coupling the output of the emitter regions of a plurality of laser diodes into a fiber optic bundle including the steps of:

optically coupling the output radiation of said each of said emitter regions into a different region of a microlens comprising an optical fiber, said microlens spaced from each of said emitter regions by a distance of about where R is the radius of and n is the index of refraction of said microlens, said microlens having a diameter about 20% to 50% larger than the lateral dimensions of said emitter regions, separately optically coupling the output radiation of said microlens corresponding to the output of each of said emitter regions into the ends of different ones of a plurality of optical fibers, each of said optical fibers having a diameter about equal to the diameter of said microlens, the ends of said optical fibers spaced as closely as possible to said microlens, said optical fibers having a numerical aperture about equal to the numerical aperture of said emitter regions of said laser diode in its low direction.

24. The method of claim 23 including the further step of optically coupling a focussing lens to the far end of a plurality of said optical fibers arranged as a bundle of optical fibers.

25. In combination:

a laser diode having an emitter region having an output facet, a microlens comprising an optical fiber oriented substantially perpendicular to and positioned in the emission path of radiation from said emitter region to be optically coupled thereto and spaced therefrom by a distance of approximately one focal length of said microlens, an optical fiber oriented on axis with respect to said microlens such that radiation from said emitter region is optically coupled into said optical fiber.

26. The combination of claim 25 wherein said microlens is substantially cylindrical in cross section and has a diameter chosen to be about 20% to 50% larger than the lateral dimension of said emitter region of said laser diode.

27. The combination of claim 26 wherein the diameter of said optical fiber is chosen to be about equal to the diameter of said cylindrical microlens.

28. The combination of claim 26 wherein said cylindrical mocrolens has an antireflective coating.

29. The combination of claim 25 wherein said microlens has a cross sectional shape selected to correct a selected spherical aberration and with an effective aperture approximately the same size as said optical fiber, said microlens placed approximately one focal length from said output facet of said laser diode.

30. The combination of claim 25 wherein the numerical aperture of said optical fiber is chosen to be about equal to the numerical aperture in the low numerical aperture direction of said laser diode.

31. The combination of claim 30, wherein the numerical aperture of said optical fibers is chosen to be between about 0.1 to 0.2.

32. The combination of claim 25 wherein said microlens is an optical fiber.

33. The combination of claim 25, further including a focussing lens at the far end of said optical fiber.

34. In combination:

a laser diode having an emitter region, a cylindrical microlens comprising an optical fiber positioned in the emission path of radiation from said emitter region and spaced therefrom by a distance approximately equal to where R is the radius of and n is the index of refraction of said microlens, an optical fiber oriented on axis with respect to said microlens such that radiation from said emitter region is optically coupled into said fiber.

35. The combination of claim 34 wherein said microlens is substantially cylindrical in cross section and has a diameter chosen to be about 20% to 50% larger than the lateral dimension of said emitter region.

36. The combination of claim 34 wherein said microlens has a cross sectional shape selected to correct a selected spherical aberration and has an effective diameter approximately equal to the diameter of the optical fiber to be coupled.

37. The combination of claim 34 wherein the diameter of said optical fiber is chosen to be about equal to the diameter of said cylindrical microlens.

38. The combination of claim 37, wherein the numerical aperture of said optical fiber is chosen to be between about 0.1 to 0.2.

39. The combination of claim 34 wherein the numerical aperture of said optical fiber is chosen to be about equal to the numerical aperture in the low numerical aperture direction of the diode.

40. The combination of claim 34 wherein said optical fiber is rectangular in cross section, said cross section having a width chosen to be slightly larger than the emitting area of said emitter region and a length of between about 30 to 50 microns.

41. The combination of claim 34 wherein said microlens has an antireflective coating.

42. The combination of claim 34 further including a focussing lens at the far end of said optical fiber.

* * * * *